(12) United States Patent
Iida et al.

(10) Patent No.: US 10,377,239 B2
(45) Date of Patent: Aug. 13, 2019

(54) AUXILIARY BATTERY STATUS DETERMINATION DEVICE AND AUXILIARY BATTERY STATUS DETERMINATION METHOD

(71) Applicant: Panasonic Intellectual Property Management Co., Ltd., Osaka (JP)

(72) Inventors: Takuma Iida, Kanagawa (JP); Hiroyuki Jimbo, Aichi (JP); Takeshi Chiba, Osaka (JP); Shunsuke Nitta, Ishikawa (JP); Kazuhiro Sugie, Shizuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 82 days.

(21) Appl. No.: 15/573,789

(22) PCT Filed: Mar. 3, 2016

(86) PCT No.: PCT/JP2016/001160
§ 371 (c)(1),
(2) Date: Nov. 13, 2017

(87) PCT Pub. No.: WO2016/194271
PCT Pub. Date: Dec. 8, 2016

(65) Prior Publication Data
US 2018/0147942 A1    May 31, 2018

(30) Foreign Application Priority Data

Jun. 5, 2015   (JP) ................. 2015-114644

(51) Int. Cl.
*B60L 3/12*   (2006.01)
*B60L 1/00*   (2006.01)
(Continued)

(52) U.S. Cl.
CPC .................. *B60L 3/12* (2013.01);
*B60L 1/00* (2013.01); *B60L 3/0046* (2013.01);
*B60L 58/20* (2019.02);
(Continued)

(58) Field of Classification Search
CPC ........ G01R 31/00; G01R 31/08; G01R 31/28; G01R 31/36; G01R 31/3624;
(Continued)

(56) References Cited

U.S. PATENT DOCUMENTS 7,030,618 B2 *  4/2006  Nakamura ........ H01M 10/4242
                                              324/430
7,633,265 B2 * 12/2009  Matsushima ............. H02J 7/00
                                              320/134
(Continued)

FOREIGN PATENT DOCUMENTS

| JP | 8-093517 A | 4/1996 |
| JP | 2007-216707 A | 8/2007 |
| JP | 2011-257214 A | 12/2011 |

OTHER PUBLICATIONS

International Search Report of PCT application No. PCT/JP2016/001160 dated May 17, 2016.

*Primary Examiner* — Hoai-An D. Nguyen
(74) *Attorney, Agent, or Firm* — Seed IP Law Group LLP

(57) ABSTRACT

A sensor of a status determination device detects a magnitude of a terminal voltage of an auxiliary battery provided separately from a driving battery and a magnitude of a current flowing through the auxiliary battery. The driving battery is an electrical power source for a driving motor of a vehicle, and the auxiliary battery is an electrical power source for auxiliary equipment and has an output voltage lower than that of the driving battery. An internal resistance calculator calculates an internal resistance of the auxiliary battery based on the magnitude of the terminal voltage and
(Continued)

the magnitude of the current detected by the sensor in a stable period that is before the auxiliary equipment is started and in which the magnitude of the terminal voltage and the magnitude of the current fall within predetermined fluctuation ranges, and those detected in a period after starting of the auxiliary equipment is detected.

5 Claims, 5 Drawing Sheets

(51) Int. Cl.

| | | |
|---|---|---|
| *G01R 31/36* | (2019.01) | |
| *H01M 10/42* | (2006.01) | |
| *H01M 10/48* | (2006.01) | |
| *G01R 31/389* | (2019.01) | |
| *G01R 31/3842* | (2019.01) | |
| *B60L 3/00* | (2019.01) | |
| *H02J 7/34* | (2006.01) | |
| *B60L 58/20* | (2019.01) | |

(52) U.S. Cl.
CPC ........... *G01R 31/36* (2013.01); *G01R 31/389* (2019.01); *G01R 31/3842* (2019.01); *H01M 10/425* (2013.01); *H02J 7/34* (2013.01); *H01M 10/48* (2013.01); *H01M 2220/20* (2013.01)

(58) Field of Classification Search
CPC ............ G01R 31/3662; G01R 31/3842; G01R 31/389; G01R 31/396; G01R 27/00; G01R 27/08; G01R 27/26; G01R 19/00; G01R 19/0084; G01R 19/0092; B60L 1/00; B60L 3/0046; B60L 3/12; B60L 58/20; H02J 7/0021; H02J 7/0044; H02J 7/0047; H02J 7/34; H02J 2007/0049; H01M 10/425; H01M 10/48; H01M 2220/20; G01N 2030/645
USPC ....... 324/425, 426, 430, 433, 439, 500, 512, 324/522, 600, 649, 691, 713, 76.11, 98; 320/134, 136, 148, 149; 702/1, 57, 60, 702/63, 64
See application file for complete search history.

(56) References Cited

U.S. PATENT DOCUMENTS

| | | | | |
|---|---|---|---|---|
| 9,213,069 | B2* | 12/2015 | Joe | ......................... H01M 4/364 |
| 2006/0186890 | A1* | 8/2006 | Iwane | .................. G01R 31/392 |
| | | | | 324/426 |
| 2016/0064979 | A1* | 3/2016 | Huang | .................. H02J 7/0055 |
| | | | | 320/114 |
| 2018/0003774 | A1* | 1/2018 | Iida | ......................... G01R 31/36 |
| 2018/0024200 | A1* | 1/2018 | Hiwa | ..................... G01R 31/36 |
| | | | | 702/63 |

* cited by examiner

AUXILIARY BATTERY STATUS DETERMINATION DEVICE AND AUXILIARY BATTERY STATUS DETERMINATION METHOD

This application is a U.S. national stage application of the PCT International Application No. PCT/JP2016/001160 filed on Mar. 3, 2016, which claims the benefit of foreign priority of Japanese patent application No. 2015-114644 filed on Jun. 5, 2015, the contents all of which are incorporated herein by reference.

TECHNICAL FIELD

The present invention relates to a status determination device and an auxiliary battery status determination method for determining a status of an auxiliary battery provided separately from a driving battery serving as an electrical power source for a driving motor of a vehicle.

BACKGROUND ART

In recent years, vehicles that incorporate a start-stop function have been increasing in number. A battery with which such a vehicle is equipped is put under high load. For this reason, it is important to monitor the status of the battery.

For example, Patent Literature 1 discloses a device equipped with a small full-scale current sensor to estimate the status of a battery for starting the engine. This device estimates the status of the battery employing a current value before a high inrush current flows, in other words, a current value that can be measured with the small full-scale current sensor, when it is determined that a starter switch is turned into an on-state.

CITATION LIST

Patent Literature

PTL 1: Japanese Patent Unexamined Publication No. 2011-257214

SUMMARY OF THE INVENTION

An auxiliary battery status determination device according to the present invention includes a sensor configured to detect a magnitude of a terminal voltage of an auxiliary battery provided separately from a driving battery and a magnitude of a current flowing through the auxiliary battery. The driving battery is an electrical power source for a driving motor of a vehicle, and the auxiliary battery is an electrical power source for auxiliary equipment and has an output voltage lower than an output voltage of the driving battery. The auxiliary battery status determination device also includes an internal resistance calculator configured to calculate an internal resistance of the auxiliary battery based on the magnitude of the terminal voltage and the magnitude of the current detected by the sensor. The internal resistance calculator calculates the internal resistance based on the magnitude of the terminal voltage and the magnitude of the current detected by the sensor in a stable period that is before the auxiliary equipment is started and in which the magnitude of the terminal voltage and the magnitude of the current fall within predetermined fluctuation ranges, and the magnitude of the terminal voltage and the magnitude of the current detected by the sensor in a predetermined period after starting of the auxiliary equipment is detected.

An auxiliary battery status determination method according to the present invention includes a detection step of detecting a magnitude of a terminal voltage of an auxiliary battery provided separately from a driving battery and a magnitude of a current flowing through the auxiliary battery. The driving battery is an electrical power source for a driving motor of a vehicle, and the auxiliary battery is an electrical power source for auxiliary equipment and has an output voltage lower than an output voltage of the driving battery. The auxiliary battery status determination method also includes an internal resistance calculating step of calculating an internal resistance of the auxiliary battery, based on the magnitude of the terminal voltage and the magnitude of the current detected in the detection step. The internal resistance calculating step calculates the internal resistance based on the magnitude of the terminal voltage and the magnitude of the current detected in the detection step in a stable period that is before the auxiliary equipment is started and in which the magnitude of the terminal voltage and the magnitude of the current fall within predetermined fluctuation ranges, and the magnitude of the terminal voltage and the magnitude of the current detected in the detection step in a predetermined period after starting of the auxiliary equipment is detected.

The present invention makes it possible to accurately and appropriately determine the status of an auxiliary battery in which a high inrush current does not flow.

DESCRIPTION OF EMBODIMENTS

Prior to describing exemplary embodiments of the present invention, problems in the device of the related art are described briefly.

A problem with the technology of the related art described in Patent Literature 1 is that it is difficult to determine the battery status of the auxiliary battery in which a high inrush current does not flow. The auxiliary battery refers to a battery that serves as an electrical power source for auxiliary equipment and is provided separately from a driving battery for supplying a large amount of electric power to a driving motor of a hybrid automotive vehicle or the like. The output voltage of the auxiliary battery is set lower than the output voltage of the driving battery.

It is an object of the present invention to provide an auxiliary battery status determination device and an auxiliary battery status determination method that are capable of accurately and appropriately determining the status of an auxiliary battery in which a high inrush current does not flow.

Hereinafter, an exemplary embodiment of the present invention will be described in detail with reference to the drawings as appropriate.

Configuration of Vehicle equipped with Status Determination Device

Figure 1:
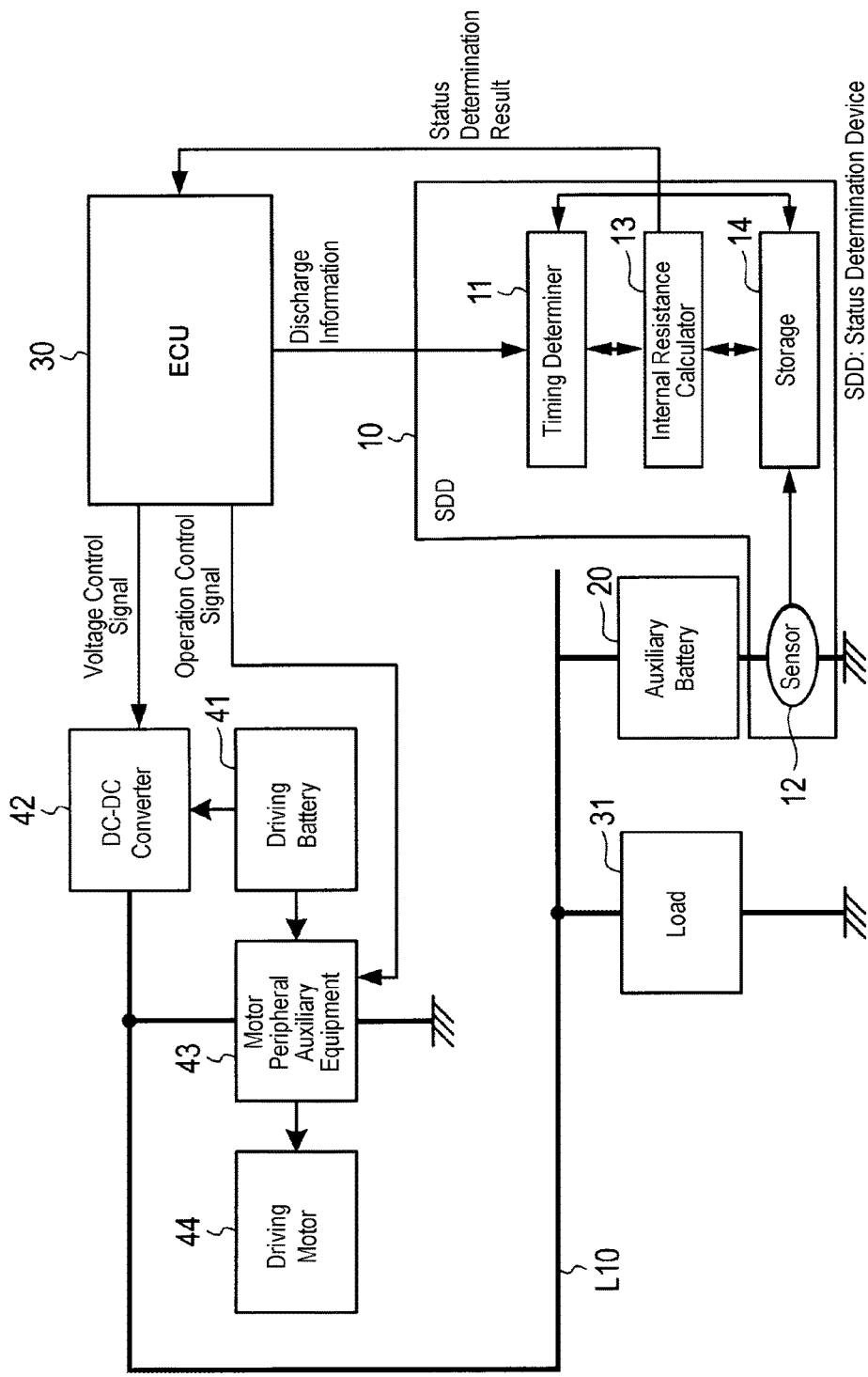
FIG. 1 is a block diagram illustrating a portion of a vehicle equipped with a status determination device according to the present exemplary embodiment.

With reference to FIG. 1, the configuration of a vehicle equipped with status determination device 10 according to the present exemplary embodiment will be described in detail. FIG. 1 is a block diagram illustrating a portion of the vehicle equipped with status determination device 10 according to the present exemplary embodiment.

The present exemplary embodiment describes cases in which status determination device 10 is incorporated in electrically powered vehicles, such as hybrid automotive vehicles, plug-in hybrid automotive vehicles, and electric automotive vehicles. It should be noted, however, that the present invention is not limited thereto, and the invention is applicable to various vehicles as long as the vehicles are equipped with an auxiliary battery provided separately from a driving battery as an electrical power source for a driving motor of each of the vehicles. The auxiliary battery serves as an electrical power source for auxiliary equipment and has an output voltage lower than an output voltage of the driving battery.

As illustrated in FIG. 1, this vehicle has status determination device 10, auxiliary battery 20, ECU (electric control unit) 30, load 31, DC-DC converter 42, motor peripheral auxiliary equipment 43, and driving motor 44.

Status determination device 10 is a device for determining the status of auxiliary battery 20. Status determination device 10 determines the status of auxiliary battery 20 at timing according to discharge information that is output from ECU 30. The details of the configuration of status determination device 10 will be described later.

Auxiliary battery 20 is a rechargeable battery, such as a lead-acid battery. Auxiliary battery 20 supplies electric power to load 31, ECU 30, motor peripheral auxiliary equipment 43, and status determination device 10. Auxiliary battery 20 is charged by driving battery 41 via DC-DC converter 42.

ECU 30 controls devices with which the vehicle is equipped. For example, ECU 30 transmits an operation control signal to control motor peripheral auxiliary equipment 43, and also transmits a voltage control signal to DC-DC converter 42 to control DC-DC converter 42.

ECU 30 also transmits, to status determination device 10, discharge information indicating that auxiliary battery 20 discharge. In addition, ECU 30 receives, from status determination device 10, information indicating the status determination result for auxiliary battery 20, and controls operations according to the determination result.

Load 31 is various electrical devices with which the vehicle is equipped, such as an air-conditioner, in-vehicle lights, an instrument panel, and a lighting system.

Driving battery 41 supplies high electric power used for driving the vehicle to driving motor 44 via motor peripheral auxiliary equipment 43. Driving battery 41 is, for example, a lithium-ion battery.

DC-DC converter 42 lowers the voltage of driving battery 41 and outputs the electric power of driving battery 41 to power supply line L10. This enables DC-DC converter 42 to supply electric power to load 31 and to charge auxiliary battery 20. DC-DC converter 42 is controlled by ECU 30.

Motor peripheral auxiliary equipment 43 is an auxiliary device that is necessary to drive driving motor 44. Motor peripheral auxiliary equipment 43 includes, for example, a relay switch for opening and closing a contact point of the power line with driving battery 41 and a contact point of the power line with an inverter circuit in driving motor 44. Motor peripheral auxiliary equipment 43 is driven by electric power of auxiliary battery 20 based on an operation control signal that is output by ECU 30.

Driving motor 44 drives the vehicle. Driving motor 44 receives supply of electric power from driving battery 41 to drive the vehicle.

Configuration of Status Determination Device

Next, the configuration of status determination device 10 will be described in detail with reference to FIG. 1.

Status determination device 10 includes timing determiner 11, sensor 12, internal resistance calculator 13, and storage 14.

Herein, except for the elements of the sensor 12 (such as resistors for detecting current), various function blocks of status determination device 10 may be constructed as a single-chip semiconductor integrated circuit. Alternatively, except for the elements of the sensor 12, status determination device 10 may be constructed of a plurality of semiconductor integrated circuits.

Yet alternatively, a portion of status determination device 10, or the whole of status determination device 10 except for the elements of the sensor 12, may be constructed of a single semiconductor integrated circuit, together with ECU 30 or another ECU incorporated in the vehicle. Furthermore, a plurality of function blocks of status determination device 10 may be integrated into a single function block.

Timing determiner 11 determines, based on discharge information that is transmitted from ECU 30, timing at which the status of auxiliary battery 20 should be determined. Timing determiner 11 transmits a signal to internal resistance calculator 13 at the above-mentioned timing, to notify internal resistance calculator 13 that it is the timing at which the status of auxiliary battery 20 should be determined.

Sensor 12 detects the charge-discharge current and the terminal voltage of auxiliary battery 20. The values of the charge-discharge current and the terminal voltage that are detected by sensor 12 are stored in storage 14.

Based on the timing notified by timing determiner 11, internal resistance calculator 13 reads out the values of the discharge current and the terminal voltage stored in storage 14 from storage 14. Then, internal resistance calculator 13 carries out a status determination process of calculating the internal resistance of auxiliary battery 20 using the values read out from storage 14. The details of the status determination process will be described later.

Also, internal resistance calculator 13 notifies ECU 30 of the calculated result of the internal resistance as a status determination result. It is also possible that internal resistance calculator 13 may output the status determination result to another control unit. Alternatively, it is also possible that, based on the status determination result, a display unit, not shown, of status determination device 10 may display the result or issue a warning.

Storage 14 stores the values of the charge-discharge current and the terminal voltage of auxiliary battery 20 detected by sensor 12.

Operation of Vehicle equipped with Status Determination Device

Next, operations of a vehicle equipped with status determination device 10 according to the present exemplary embodiment will be described in detail.

When starting this vehicle, motor peripheral auxiliary equipment 43 is driven by electric power of auxiliary battery 20. This enables electric power to be supplied from driving battery 41 to driving motor 44. Then, after driving motor 44 is operated by electric power of driving battery 41, auxiliary battery 44 is charged from driving battery 41 via DC-DC converter 42.

Thus, when starting the vehicle by driving motor 44, switching of auxiliary battery 20 from discharge control to charge control takes place.

ECU 30 transmits discharge information indicating that auxiliary battery 20 discharges, to timing determiner 11 of status determination device 10. Specifically, ECU 30 transmits this discharge information to timing determiner 11 when transmitting an operation control signal for operating motor peripheral auxiliary equipment 43 to motor peripheral auxiliary equipment 43.

Based on the discharge information received from ECU 30, timing determiner 11 determines timing at which the discharge current and the terminal voltage of auxiliary battery 20 should be detected, and notifies internal resistance calculator 13 of the timing.

Figure 2:
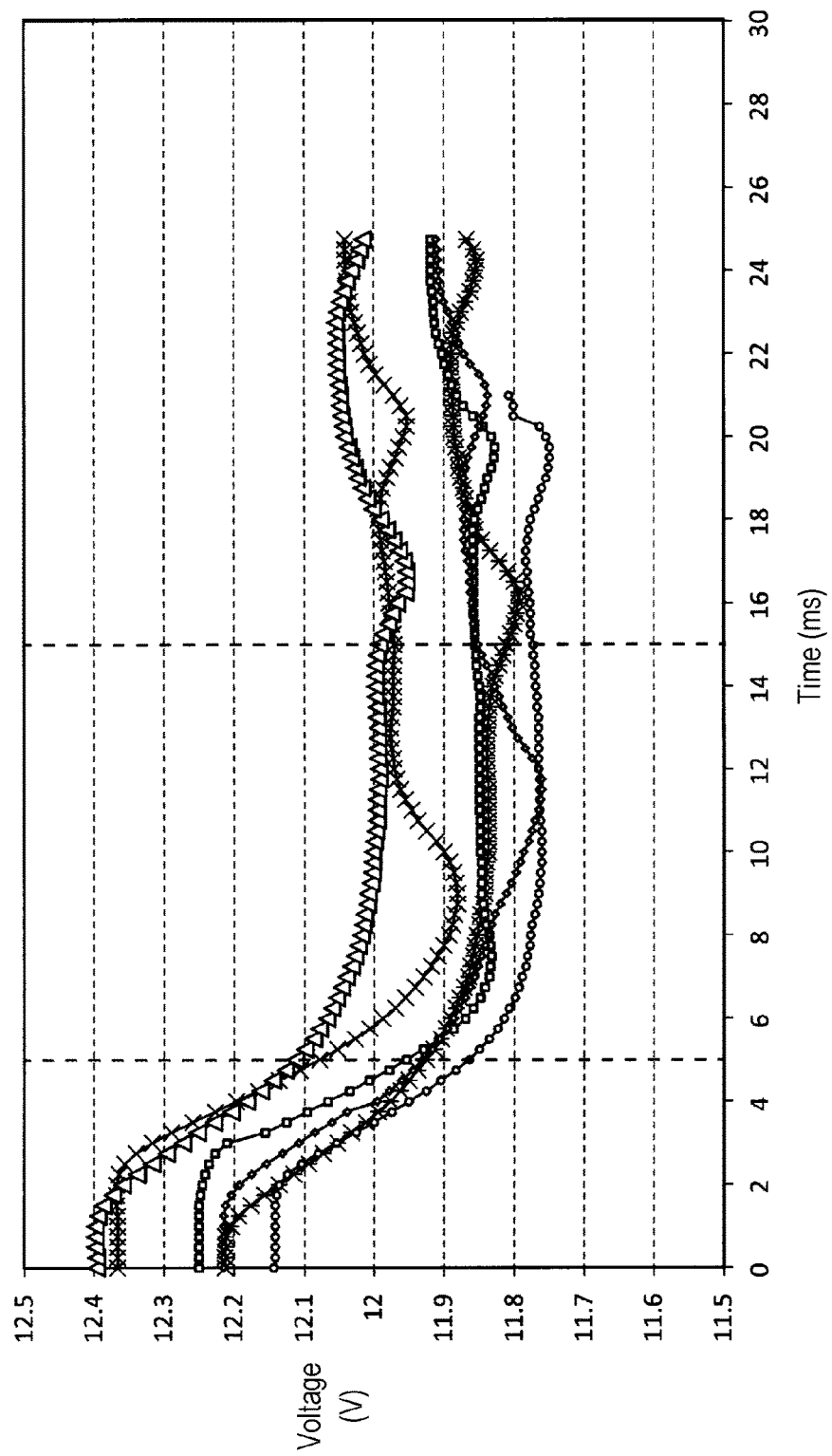
FIG. 2 is a graph showing the voltage of an auxiliary battery according to an exemplary embodiment of the present invention.
Figure 3:
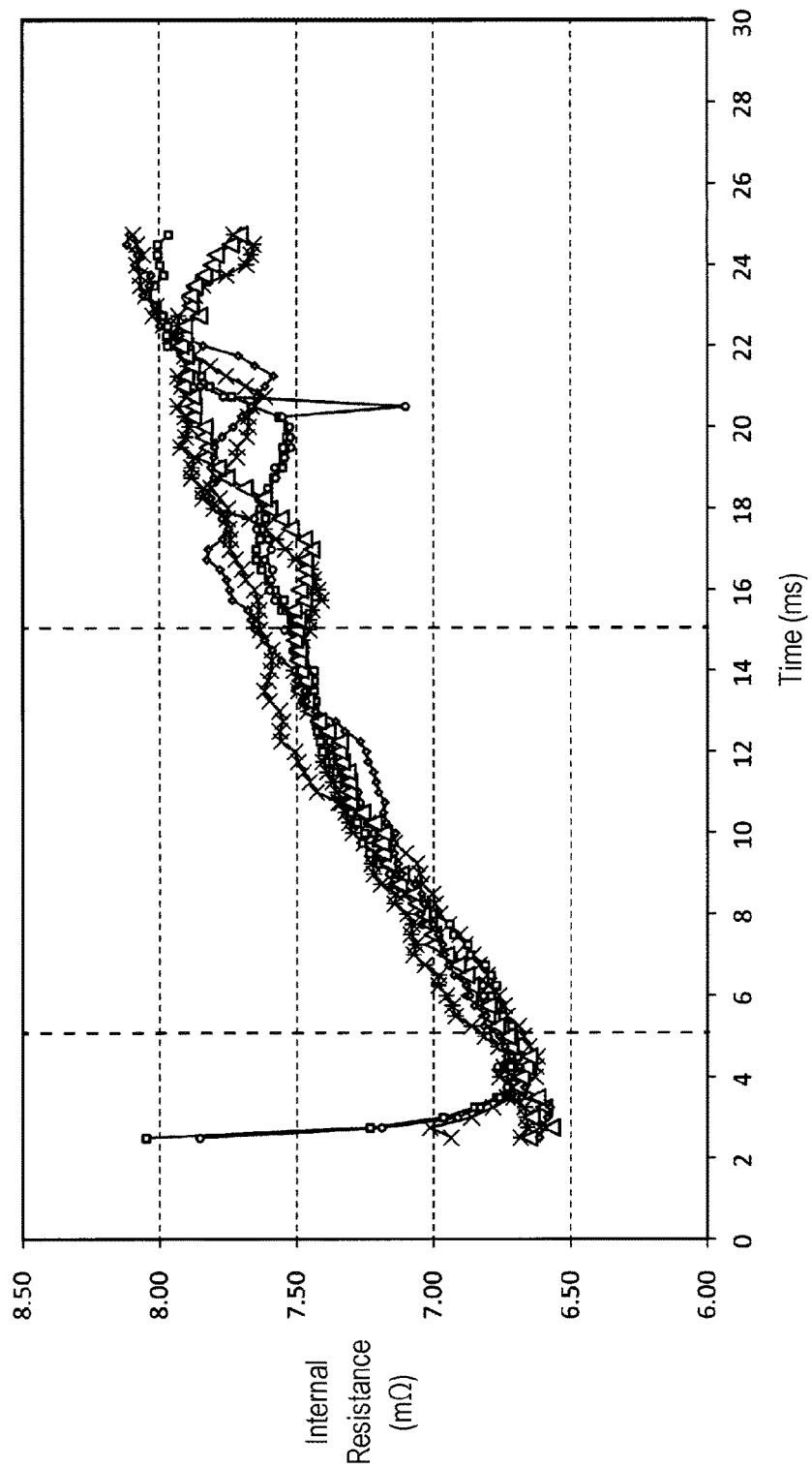
FIG. 3 is a graph showing the internal resistance of the auxiliary battery according to the exemplary embodiment of the present invention.
Figure 4:
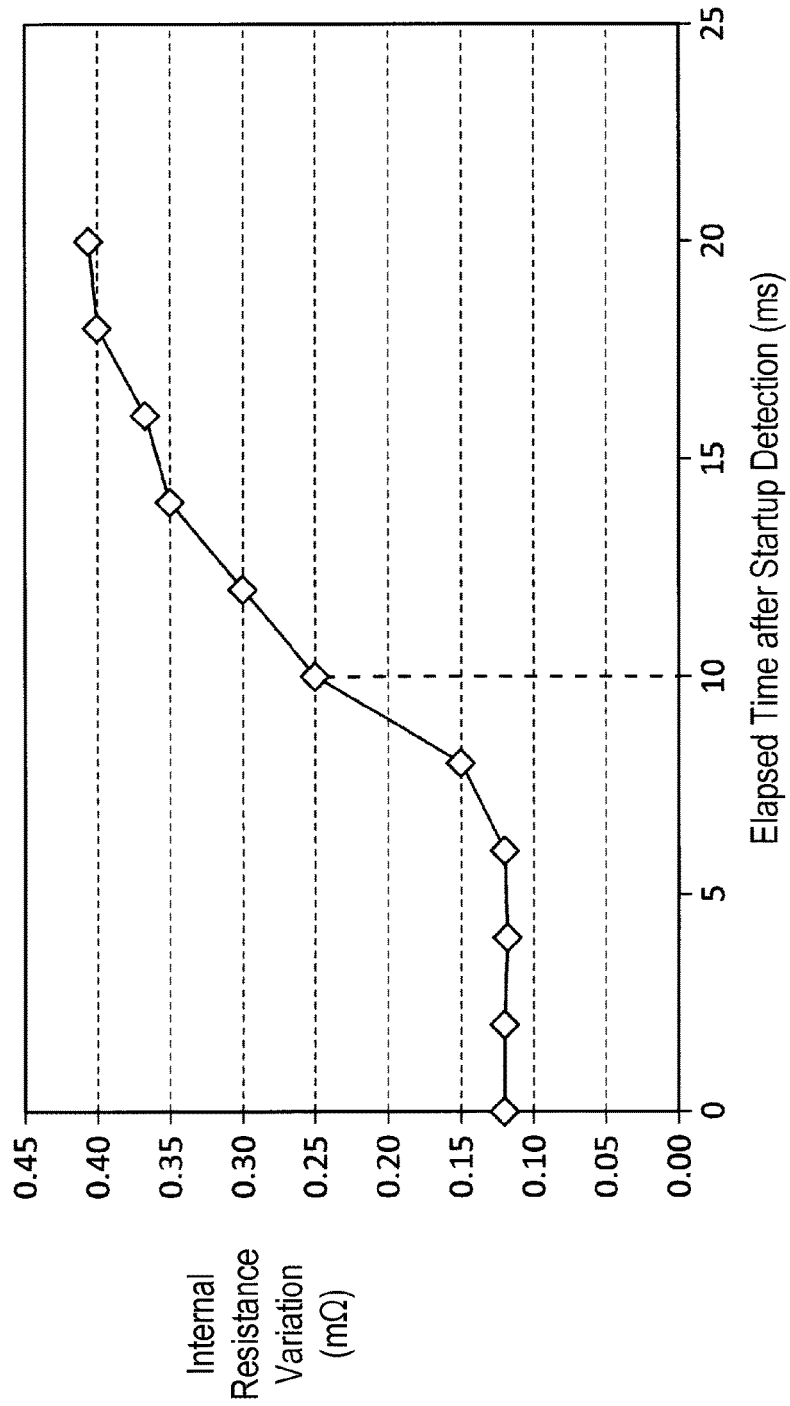
FIG. 4 is a graph showing variations in the internal resistance of the auxiliary battery according to the exemplary embodiment of the present invention.

Detection Timing for Discharge Current and Terminal Voltage of Auxiliary Battery According to the present exemplary embodiment, detection timing for the discharge current and the terminal voltage of auxiliary battery 20 will be described in detail with reference to FIGS. 2 to 4. FIG. 2 is a graph showing some examples of voltage fluctuations of auxiliary battery 20, FIG. 3 is a graph showing calculated results of the internal resistance of auxiliary battery 20, and FIG. 4 is a graph illustrating variations in the calculated results of the internal resistance of auxiliary battery 20. The method of calculating the internal resistance will be described later in detail.

The horizontal axis of FIG. 4 represents the elapsed time after the starting of motor peripheral auxiliary equipment 43 is detected. Whether or not motor peripheral auxiliary equipment 43 is started up may be determined in various ways.

For example, whether or not motor peripheral auxiliary equipment 43 is started up may be determined by detecting whether or not the internal resistance of auxiliary battery 20 shows a minimum value, whether or not the terminal voltage of auxiliary battery 20 drops by a predetermined value, or whether or not the discharge current of auxiliary battery 20 reaches a predetermined value.

In the example of FIG. 3, when the starting of motor peripheral auxiliary equipment 43 is detected by whether or not the internal resistance of auxiliary battery 20 shows a minimum value, the time point at which the starting is detected is a time point of 5 ms because the internal resistance shows the minimum value at the time point of 5 ms.

The terminal voltage of auxiliary battery 20 shows different profiles over time at every measurement, as shown in FIG. 2; however, the values of the internal resistance show a small variation in a period from 5 ms to 15 ms, as shown in FIG. 3. This is clear from the fact that in FIG. 4, the internal resistance variation is less than 0.25 mΩ, at which no problem arises practically, in a period from 0 ms to 10 ms.

Accordingly, timing determiner 11 detects starting of motor peripheral auxiliary equipment 43 when receiving the discharge information from ECU 30, and internal resistance calculator 13 calculates the internal resistance of auxiliary battery 20 using the discharge current and the terminal voltage within a predetermined period after timing determiner 11 detects starting of motor peripheral auxiliary equipment 43. As shown in FIG. 4, it is preferable that the predetermined period be 10 ms or less.

This serves to keep the variation of the internal resistance small, and enables an accurate and appropriate determination of the status of auxiliary battery 20 in which a high inrush current does not flow.

The predetermined period may be set as appropriate through experiments, for example. However, it is preferable that the predetermined period be set to include a time point at which the terminal voltage of auxiliary battery 20 shows the minimum value after the terminal voltage drops due to the starting of motor peripheral auxiliary equipment 43, as shown in FIG. 2.

It is also possible that the predetermined period may be set to include a time point at which the terminal voltage of auxiliary battery 20 showed the minimum value after the terminal voltage dropped due to the starting of motor peripheral auxiliary equipment 43, when sensor 12 measured the terminal voltage of auxiliary battery 20 in past time.

Status Determination Process for Auxiliary Battery

Figure 5:
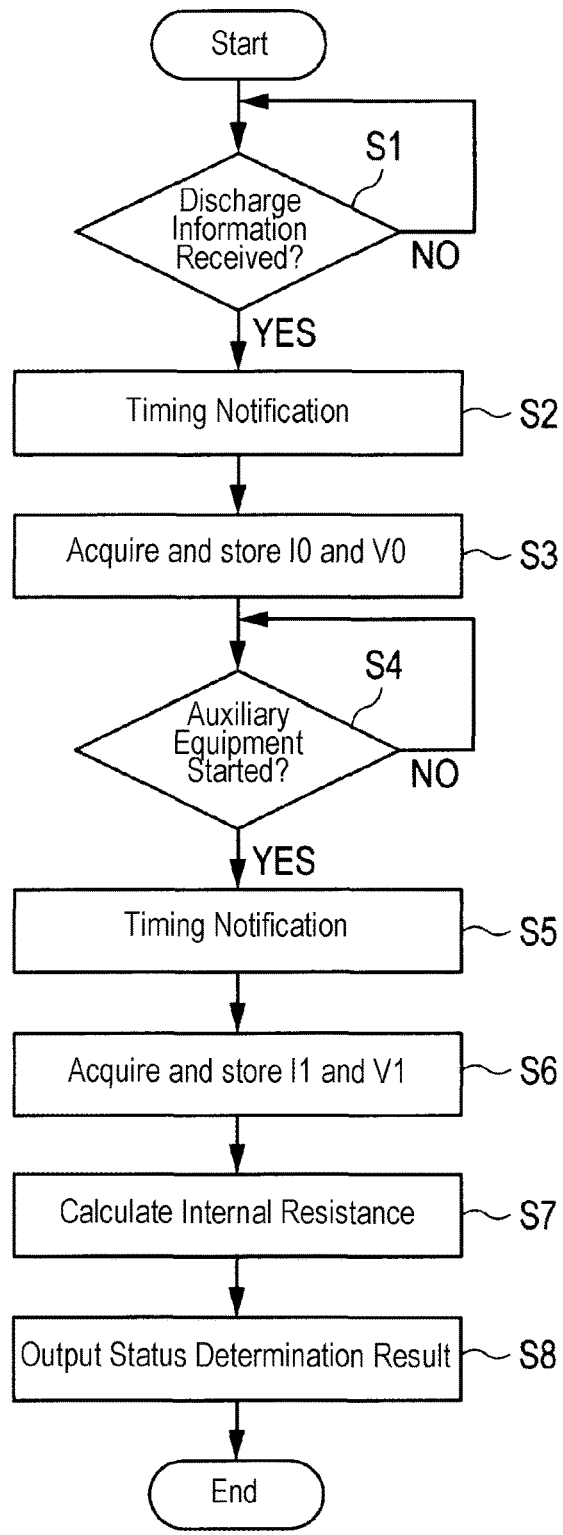
FIG. 5 is a flow-chart illustrating a status determination process of the auxiliary battery according to the exemplary embodiment of the present invention.

Next, a status determination process for auxiliary battery 20 according to the present exemplary embodiment will be described in detail with reference to FIG. 5.

First, timing determiner 11 determines whether or not discharge information is received from ECU 30 (step S1).

Then, if timing determiner 11 has not received the discharge information from ECU 30 (step S1: NO), timing determiner 11 repeats the process of step S1.

On the other hand, if timing determiner 11 receives the discharge information from ECU 30 (step S1: YES), timing determiner 11 transmits a signal to internal resistance calculator 13 and notifies internal resistance calculator 13 that it is the timing at which discharge current I0 and terminal voltage V0 of auxiliary battery 20 should be detected (step S2).

Discharge current I0 and terminal voltage V0 are a current value and a voltage value in a stable period, which is before motor peripheral auxiliary equipment 43 is started and in which the magnitude of the discharge current and the magnitude of the terminal voltage fall within predetermined fluctuation ranges. This stable period may be determined in advance based on experimental results, for example, or may be determined based on the detection results obtained by sensor 12.

Thereafter, internal resistance calculator 13 acquires detected values of discharge current I0 and terminal voltage V0 of auxiliary battery 20 from sensor 12, and stores the detected values in storage 14 (step S3).

Next, timing determiner 11 determines whether or not motor peripheral auxiliary equipment 43 is started (step S4). If timing determiner 11 determines that motor peripheral auxiliary equipment 43 is not started (step S4: NO), timing determiner 11 repeats the process of step S4.

On the other hand, if timing determiner 11 determines that motor peripheral auxiliary equipment 43 has started (step S4: YES), timing determiner 11 transmits a signal to internal resistance calculator 13 to notify internal resistance calculator 13 that it is the timing at which discharge current I1 and terminal voltage V1 of auxiliary battery 20 should be detected (step S5).

Discharge current I1 and terminal voltage V1 are a current value and a voltage value measured in a predetermined period after the starting of motor peripheral auxiliary equipment 43 is detected by timing determiner 11. For example, in the examples shown in FIGS. 2 to 4, the predetermined period is 10 ms.

Thereafter, internal resistance calculator 13 acquires, from sensor 12, the values of discharge current I1 and terminal voltage V1 of auxiliary battery 20 that are measured by sensor 12, and stores the values in storage 14 (step S6).

Then, internal resistance calculator 13 calculates an internal resistance employing a method such as a two-point method, using the values of discharge current I0 and terminal voltage V0 stored in storage 14 at step S3 and the values of discharge current I1 and terminal voltage V1 stored in storage 14 at step S6 (step S7).

In cases where the two-point method is employed, internal resistance calculator 13 calculates internal resistance Ri of auxiliary battery 20 according to the following equation (1).

$$Ri=(V0-V1)/(I0-I1) \qquad (1)$$

Then, internal resistance calculator 13 outputs the information of the calculated internal resistance Ri as a status determination result to ECU 30 (step S8).

As described above, in the present exemplary embodiment, sensor 12 of status determination device 10 detects a magnitude of a terminal voltage of auxiliary battery 20 provided separately from driving battery 41 and a magnitude of a current flowing through auxiliary battery 20. Driving battery 41 is an electrical power source for driving motor 44 of the vehicle, and auxiliary battery 20 is an electrical power source for auxiliary equipment (such as motor peripheral auxiliary equipment 43) and has the output voltage lower than the output voltage of driving battery 41. Furthermore, internal resistance calculator 13 calculates the internal resistance of auxiliary battery 20 based on the magnitude of the terminal voltage and the magnitude of the current detected in a stable period that is before the auxiliary equipment is started and in which the magnitude of the terminal voltage and the magnitude of the current fall within predetermined fluctuation ranges, and the magnitude of the terminal voltage and the magnitude of the current in a predetermined period after the starting of the auxiliary equipment is detected. The magnitude of the terminal voltage and the magnitude of the current are detected by sensor 12. This serves to keep the variation of the internal resistance small, and enables an accurate and appropriate determination of the status of auxiliary battery 20 in which a high inrush current does not flow.

Moreover, in the present exemplary embodiment, the predetermined period may be set to be a period including a time point at which the terminal voltage shows a minimum value after the terminal voltage drops due to the starting of the auxiliary equipment. This makes it possible to appropriately set the period in which the variation of the internal resistance is small.

Furthermore, in the present exemplary embodiment, the predetermined period may also be set to be a period including a time point at which the terminal voltage showed a minimum value in past time after the terminal voltage dropped due to the starting of the auxiliary equipment. This makes it possible to easily and appropriately set the period in which the variation of the internal resistance is small.

Moreover, in the present exemplary embodiment, the predetermined period is 10 milliseconds or less. This also makes it possible to easily and appropriately set the period in which the variation of the internal resistance is small.

INDUSTRIAL APPLICABILITY

The present invention is suitably applicable to a device that determines a status of an auxiliary battery, provided separately from a driving battery serving as an electrical power source for a driving motor of a vehicle. The auxiliary battery serves as an electrical power source for auxiliary equipment and has an output voltage lower than an output voltage of the driving battery.

REFERENCE MARKS IN THE DRAWINGS 10 status determination device
11 timing determiner
12 sensor
13 internal resistance calculator
14 storage
20 auxiliary battery
30 ECU
31 load
41 driving battery
42 DC-DC converter
43 motor peripheral auxiliary device
44 driving motor

The invention claimed is:

1. An auxiliary battery status determination device comprising:
   a sensor configured to detect a magnitude of a terminal voltage of an auxiliary battery provided separately from a driving battery and a magnitude of a current flowing through the auxiliary battery, the driving battery being an electrical power source for a driving motor of a vehicle, and the auxiliary battery being an electrical power source for auxiliary equipment and having an output voltage lower than an output voltage of the driving battery; and
   an internal resistance calculator configured to calculate an internal resistance of the auxiliary battery based on the magnitude of the terminal voltage and the magnitude of the current detected by the sensor,
   wherein the internal resistance calculator calculates the internal resistance based on the magnitude of the terminal voltage and the magnitude of the current detected by the sensor in a stable period that is before the auxiliary equipment is started and in which the magnitude of the terminal voltage and the magnitude of the current fall within predetermined fluctuation ranges, and the magnitude of the terminal voltage and the magnitude of the current detected by the sensor in a predetermined period after starting of the auxiliary equipment is detected.

2. The auxiliary battery status determination device according to claim 1,
   wherein the predetermined period is set to be a period including a time point at which the terminal voltage shows a minimum value after the terminal voltage drops due to the starting of the auxiliary equipment.

3. The auxiliary battery status determination device according to claim 1,
   wherein the predetermined period is set to be a period including a time point at which the terminal voltage showed a minimum value in past time after the terminal voltage dropped due to the starting of the auxiliary equipment.

4. The auxiliary battery status determination device according to claim 1,
wherein the predetermined period is 10 milliseconds or less.

5. An auxiliary battery status determination method comprising:
a detection step of detecting a magnitude of a terminal voltage of an auxiliary battery provided separately from a driving battery and a magnitude of a current flowing through the auxiliary battery, the driving battery being an electrical power source for a driving motor of a vehicle, and the auxiliary battery being an electrical power source for auxiliary equipment and having an output voltage lower than an output voltage of the driving battery; and
an internal resistance calculating step of calculating an internal resistance of the auxiliary battery based on the magnitude of the terminal voltage and the magnitude of the current detected in the detection step,
wherein in the internal resistance calculating step, the internal resistance is calculated based on the magnitude of the terminal voltage and the magnitude of the current detected in the detection step in a stable period that is before the auxiliary equipment is started and in which the magnitude of the terminal voltage and the magnitude of the current fall within predetermined fluctuation ranges, and the magnitude of the terminal voltage and the magnitude of the current detected in the detection step in a predetermined period after starting of the auxiliary equipment is detected.

* * * * *